(12) United States Patent
Kim et al.

(10) Patent No.: US 11,545,644 B2
(45) Date of Patent: Jan. 3, 2023

(54) DISPLAY DEVICE AND METHOD OF MANUFACTURING THE SAME

(71) Applicant: LG Display Co., Ltd., Seoul (KR)

(72) Inventors: Jae-Hyeon Kim, Paju-si (KR); Seok-Hyun Kim, Seoul (KR); Kwan-Soo Kim, Seoul (KR); Young-Nam Lim, Seoul (KR)

(73) Assignee: LG Display Co., Ltd, Seoul (KR)

( * ) Notice: Subject to any disclaimer, the term of this patent is extended or adjusted under 35 U.S.C. 154(b) by 190 days.

(21) Appl. No.: 17/137,147

(22) Filed: Dec. 29, 2020

(65) Prior Publication Data

US 2021/0202891 A1    Jul. 1, 2021

(30) Foreign Application Priority Data

Dec. 31, 2019   (KR) .................. 10-2019-0180061

(51) Int. Cl.
| | | |
|---|---|---|
| *H01L 51/52* | (2006.01) | |
| *H01L 51/56* | (2006.01) | |
| *H01L 27/32* | (2006.01) | |
| *H01L 51/00* | (2006.01) | |

(52) U.S. Cl.
CPC ......... *H01L 51/5234* (2013.01); *H01L 51/56* (2013.01); *H01L 27/3211* (2013.01); *H01L 27/3244* (2013.01); *H01L 51/0091* (2013.01); *H01L 51/0096* (2013.01); *H01L 2251/558* (2013.01)

(58) Field of Classification Search
None
See application file for complete search history.

(56) References Cited

U.S. PATENT DOCUMENTS

| | | | | |
|---|---|---|---|---|
| 2006/0099448 | A1* | 5/2006 | Lu | H01L 51/5048 313/506 |
| 2014/0167014 | A1* | 6/2014 | Liping | H05B 33/14 257/40 |
| 2015/0287846 | A1* | 10/2015 | Helander | H01L 51/5221 427/256 |
| 2018/0047932 | A1* | 2/2018 | Popp | H01L 33/60 |

FOREIGN PATENT DOCUMENTS

| | | |
|---|---|---|
| KR | 10-0830976 B1 | 5/2008 |
| KR | 10-1347656 B1 | 1/2014 |
| KR | 10-1535186 B1 | 7/2015 |
| KR | 10-2016-0083992 A | 7/2016 |

\* cited by examiner

*Primary Examiner* — Michelle Mandala
(74) *Attorney, Agent, or Firm* — Seed IP Law Group LLP

(57) ABSTRACT

Disclosed is a display device configured such that a mixture of a transition metal and an organic material is used as a cathode, whereby the cathode exhibits low resistance, high transmittance, high reliability, and high performance in the state in which the cathode is thin.

18 Claims, 16 Drawing Sheets

FIG. 15A

| |
|---|
| SiNx (203) |
| PCL (202) |
| SiNx (201a) |
| CPL (170) |
| Cathode (240a) |
| EIL (134) |
| EL |
| Anode (111) |

FIG. 15B

| |
|---|
| SiNx (203) |
| PCL (202) |
| SiON (201b) |
| CPL (170) |
| Cathode (240b) |
| EIL (134) |
| EL |
| Anode (111) |

DISPLAY DEVICE AND METHOD OF MANUFACTURING THE SAME

CROSS-REFERENCE TO RELATED APPLICATION(S)

This application claims the benefit of Korean Patent Application No. 10-2019-0180061, filed Dec. 31, 2019, which is hereby incorporated by reference as if fully set forth herein.

BACKGROUND

Technical Field

The present disclosure relates to a display device, and more particularly to a display device configured such that a mixture of a transition metal and an organic material is used as a cathode, whereby the cathode exhibits high transmittance, low resistance, and high reliability.

Description of the Related Art

With recent entry into a full-scale information age, a display field capable of visually expressing an electrical information signal has rapidly grown, and in response thereto, various flat display devices having excellent performance, such as slimness, light weight, and low power consumption, have been developed and rapidly replaced a conventional cathode ray tube (CRT).

Representative examples of such flat display devices may include a liquid crystal display (LCD) device, a plasma display panel (PDP) device, a field emission display (FED) device, an organic light-emitting display (OLED) device, and a quantum dot display device.

Thereamong, a self-emissive display device, such as an organic light-emitting display device or a quantum dot light-emitting display device, which does not require a separate light source, is compact, and is capable of displaying vivid colors, is considered as a competitive application.

Meanwhile, the self-emissive display device has a plurality of pixels on a substrate, and a light-emitting diode including an anode and a cathode opposite each other and an emissive layer therebetween is provided in each pixel.

In the self-emissive display device, an image is displayed using light emitted from the light-emitting diode. Consequently, it is important of effectively use the extraction amount of light emitted from the light-emitting diode. In order to improve transmittance, therefore, an effort to reduce the thickness of the cathode located in the direction in which light is emitted and to improve reliability of the cathode and components therearound in order to stabilize performance of the device has been raised.

BRIEF SUMMARY

Accordingly, the present disclosure is directed to a display device and a method of manufacturing the same that substantially obviate one or more problems due to limitations and disadvantages of the related art.

An object of the present disclosure is to provide a display device configured such that a mixture of a transition metal and an organic material is used as a cathode, whereby the cathode exhibits low resistance, high transmittance, high reliability, and high performance in the state in which the cathode is thin.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

In a display device according to the present disclosure, the component of a cathode is changed, whereby the cathode exhibits high transmittance and low resistance even in a thin film state, and therefore reliability and performance are improved.

To achieve these objects and other advantages and in accordance with the purpose of the disclosure, as embodied and broadly described herein, a display device may include an anode provided at each of a plurality of light-emitting portions of a substrate, an emissive layer provided over the anode, and a cathode provided above the emissive layers to overlap the plurality of light-emitting portions of the substrate, the cathode including a transition metal and a fullerene complexed with the transition metal.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

FIG. 15A is a sectional view showing the structure of a display device used in each of fifth and sixth experimental examples.

FIG. 15B is a sectional view showing the structure of a display device used in each of seventh to ninth experimental examples.

DETAILED DESCRIPTION

Figure 1:
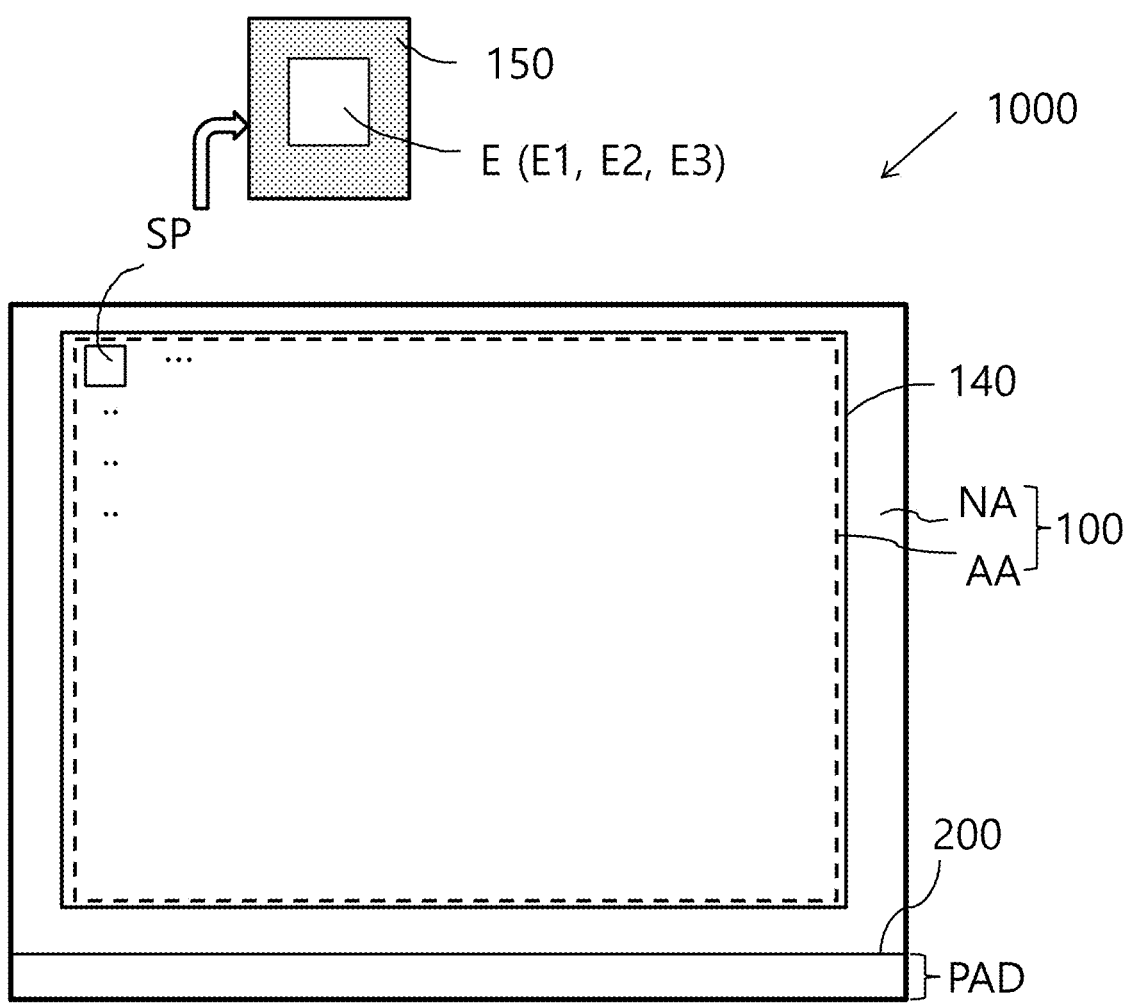
FIG. 1 is a plan view showing a display device according to a first embodiment of the present disclosure.

Reference will now be made in detail to the preferred embodiments of the present disclosure, examples of which are illustrated in the accompanying drawings. Wherever possible, the same reference numbers will be used throughout the drawings to refer to the same or like parts. In the following description of the present disclosure, a detailed description of known functions and configurations incorporated herein will be omitted when it may obscure the subject matter of the present disclosure. In addition, the terms used in the following description are selected in consideration of ease of preparation of the specification, and may be different from the names of parts constituting an actual product.

Shapes, sizes, rates, angles, and numbers shown in the drawings to describe the embodiments of the present disclosure are illustrative and thus are not limitative of the disclosure of the present disclosure. Wherever possible, the same reference numbers will be used throughout the drawings to refer to the same or like parts. Also, in the following description of the present disclosure, a detailed description of known technology incorporated herein will be omitted when it may obscure the subject matter of the present disclosure. In the case in which the terms "comprises," "has," or "includes" are used in this specification, other parts may be further added unless the term "only" is used. The singular forms are intended to include the plural forms as well, unless the context clearly indicates otherwise.

In interpreting components included in various embodiments of the present disclosure, it is to be interpreted that an error range is included unless the context clearly indicates otherwise.

In explaining various embodiments of the present disclosure, when a positional relationship is described, for example, when the positional relationship between two parts is described using terms such as "on," "above," "under," "beside," etc., one or more additional parts may be located between the two parts unless the term "immediately" or "directly" is used.

In explaining various embodiments of the present disclosure, when a temporal relationship is described, for example, when time sequences such as "after," "subsequently," "next," and "before" are described, discontinuous sequences may be included unless the term "immediately" or "directly" is used.

In explaining various embodiments of the present disclosure, the terms "first," "second," etc., are used to describe various elements. However, these terms are used only to distinguish between the elements. In this specification, therefore, a component identified by "first" may be identical to a component identified by "second" within the technical spirit of the present disclosure unless the context clearly indicates otherwise.

Features of various embodiments of the present disclosure may be partially or entirely coupled to or combined with each other, and may be technically interlocked and driven in various manners. Various embodiments may be realized independently or in combination with each other.

A display device according to the present disclosure is characterized in that a cathode used as an electrode of a light-emitting device in a substrate is made of a mixture of a transition metal and a fullerene. In the cathode made of the mixture of the transition metal and the fullerene, some carbon atoms of the fullerene and the transition metal are complexed with each other, whereby aggregation of the transition metal may be prevented and the film property of the cathode may be stabilized. In particular, the cathode made of the mixture of the fullerene and the transition metal exhibits high transmittance and low resistance, whereby transmission efficiency of the display device may be improved. In addition, even when the cathode is realized as a thin film, fluctuation of the cathode at high temperature is minimal, whereby high reliability may be maintained.

Figure 2:
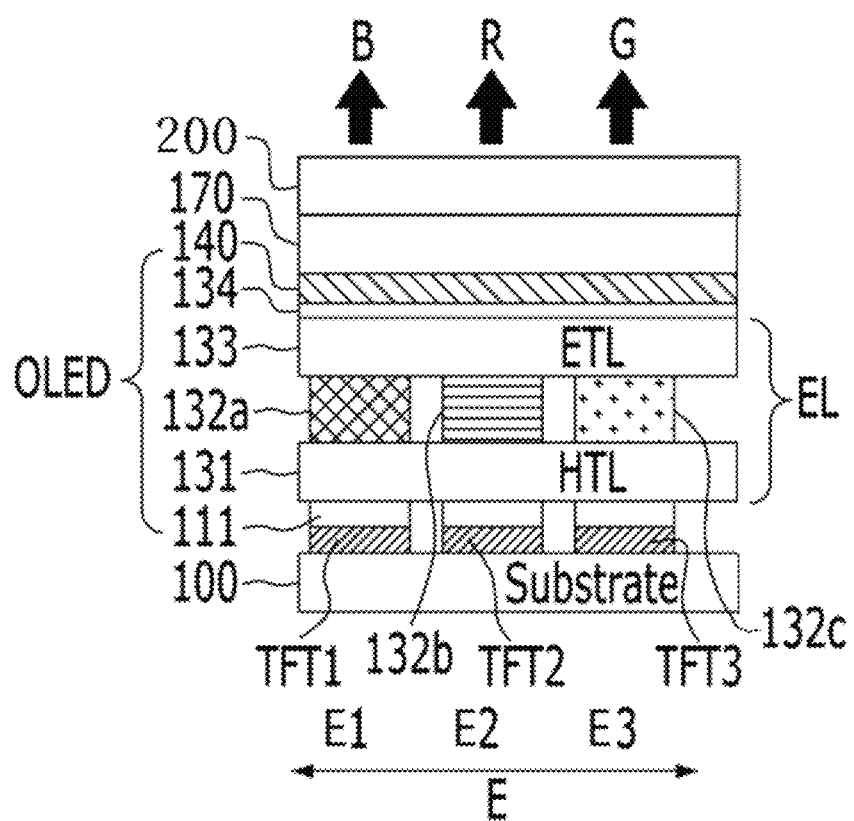
FIG. 2 is a sectional view showing an organic light-emitting device provided at each light-emitting portion of FIG. 1.

FIG. 1 is a plan view showing a display device according to a first embodiment of the present disclosure, and FIG. 2 is a sectional view showing an organic light-emitting device provided at each light-emitting portion of FIG. 1.

As shown in FIGS. 1 and 2, the display device 1000 according to the first embodiment of the present disclosure may include an anode 111 provided at each of a plurality of light-emitting portions E1, E2, and E3 of a substrate 100, emissive layers 132a, 132b, and 132c provided on the respective anodes, and a cathode 140 provided above the emissive layers so as to overlap the plurality of light-emitting portions E1, E2, and E3, each of which may be a subpixel, of the substrate 100, the cathode including a transition metal and a fullerene complexed with the transition metal.

The substrate 100 is divided into an active area AA having a plurality of subpixels SP (an area inside a dotted line) and a non-active area NA outside the active area. Each of the subpixels SP includes a light-emitting portion E (E1, E2, or E3), and the light-emitting portion may be defined as an open area of a bank 150. In order to express various colors, the light-emitting portions E1, E2, and E3 configured to emit different colors may be disposed adjacent to each other.

An organic light-emitting device OLED is provided at each of the light-emitting portions E1, E2, and E3 to emit light. The organic light-emitting device OLED includes an anode 111, an organic stack EL, and a cathode 140. The anodes 111 of the light-emitting portions E1, E2, and E3 are connected to thin film transistors TFT1, TFT2, and TFT3, respectively, to receive electrical signals.

Each subpixel SP may include blue, green, and red light-emitting portions E1, E2, and E3, and a combination of other colors is also possible.

The light-emitting portions E (E1, E2, and E3) may be parallel to each other in the same row, which, however, is an example. The light-emitting portions may be disposed in the diagonal direction, or may be differently arranged in a column. In addition, the light-emitting portions may have the same size. However, the present disclosure is not limited thereto. The size of the light-emitting portions may be changed depending on the color temperature property of the display device to be expressed. Each of the light-emitting portions E (E1, E2, and E3) is shown as having a quadrangular shape. However, the present disclosure is not limited thereto. Each of the light-emitting portions may have a polygonal shape other than the quadrangular shape, an oval shape, or a shape in which at least some of corners are round. Depending on circumstances, corners of the light-emitting portions E (E1, E2, and E3) may be disposed so as to neighbor each other while being spaced apart from each other by a predetermined distance.

In addition, the light-emitting portions E (E1, E2, and E3) may have different shapes. The sizes of the light-emitting portions E1, E2, and E3 configured to emit different colors may be changed depending on intended color properties of the display device.

In order to improve transmittance of the display device, the size of a single transmission unit T may be greater than the size of at least a single light-emitting portion E1, E2, or E3.

Meanwhile, the bank 150 is provided around the light-emitting portions E (E1, E2, and E3) and the transmission unit T (FIG. 12) to define the same. The bank 150 may overlap a portion of the edge of the anode 111.

For example, the subpixels configured to emit different colors, provided at the light-emitting portions E, may be the red, green, and blue subpixels arranged as described above. However, the present disclosure is not limited thereto. The light-emitting portions E may further include a white subpixel. Alternatively, an arrangement other than the arrangement of red, green, and blue, for example, the arrangement of cyan, magenta, and yellow may be provided, or the arrangement of subpixels having a combination of different colors may be provided. Depending on components provided in the emissive layer, the light-emitting device of the light-emitting portion may be used as an organic light-emitting device (OLED) or an inorganic light-emitting device.

In the following description, an organic light-emitting device using an organic emissive layer as the emissive layer will be described. However, a layer including a quantum dot emissive layer may be used instead of the organic emissive layer such that a quantum dot light-emitting device is provided at the light-emitting portion.

The organic stack EL includes an emissive layer 132a, 132b, or 132c configured to substantially emit light by recombination of a hole and an electron, a hole transport layer (HTL) 131 configured to transmit holes from the anode 111 to the emissive layer 132a, 132b, or 132c, and an electron transport layer (ETL) 133 configured to transmit electrons from the cathode 140 to the emissive layer 132a, 132b, or 132c.

A hole injection layer (not shown) may be further provided between the hole transport layer 131 and the anode 111, and an electron injection layer 134 may be further provided between the electron transport layer 133 and the cathode 140. The electron injection layer 134 may be made of only an inorganic compound or a metal without including an organic material, and may be formed together in the process of forming the cathode 140. The hole injection layer and the electron injection layer may be omitted. Depending on circumstances, each of the hole transport layer 131 and the electron transport layer 133 may be formed to have a plurality of layers.

The substrate 100 may be transparent like glass or transparent plastic film or may not be transparent such as a metal substrate. In cases in which the transmission unit is included, the substrate may be made of a transparent material to the extent capable of rear transmission, e.g., a glass substrate or transparent plastic film. In cases in which permanent flexibility or in-use flexibility is necessary, the substrate is frequently made of a transparent plastic film. Even in cases in which a glass substrate is applied, however, the thickness thereof may be reduced for application.

A capping layer 170 configured to improve light extraction and to protect the organic light-emitting device (OLED) may be formed on the organic light-emitting device (OLED).

Meanwhile, a pad unit PAD is provided at one side of the non-active area NA of the substrate 100. A pad electrode (not shown) may be provided at the pad unit PAD, and may be connected to a separate circuit film (not shown). The circuit film may be connected to the circuit board (not shown), and may transmit an electrical signal from the circuit board to the pad electrode. The thin film transistors TFT1, TFT2, and TFT3 may be connected to a first wire (not shown) and a second wire (not shown) that intersect each other, and extensions of the first and second wires may be connected to the pad electrode to receive an electrical signal.

In the display device according to the first embodiment of the present disclosure, the cathode 140 is formed in the entirety of the active area AA and a portion of the non-active area NA. The cathode 140 of the display device according to the present disclosure is a component of the organic light-emitting device OLED, that is, one of the electrodes of the organic light-emitting device OLED in conjunction with the anode 111, and is characterized in that the cathode 140 is used in a top emission structure in which the cathode 140 is formed as a thin film. To maintain transmittance, the cathode 140 of the present disclosure is made of a mixture of a transition metal and a fullerene such that the cathode 140 has low resistance and high reliability even in a thin film state.

Meanwhile, as shown in FIG. 1, an encapsulation layer 200 configured to completely cover the cathode 140 is formed on the capping layer 170 in the active area AA and the non-active area NA excluding the pad unit PAD. The encapsulation layer 200 is configured to prevent external moisture permeation and to protect the array (including the thin film transistor) formed in the entirety of the active area AA as well as the organic light-emitting device OLED. The encapsulation layer 200 is thus formed to have a larger area than that of the cathode 140, which is one of the components of the organic light-emitting device OLED.

Meanwhile, the encapsulation layer 200 may include a stack of an inorganic encapsulation film, an organic encapsulation film, and an inorganic encapsulation film. In addition, a pair of organic and inorganic encapsulation films may be further included.

The cathode 140 may have a connection portion (not shown) connected to a portion of the wire connected to the pad unit PAD on the substrate 100 to receive a ground signal or a predetermined voltage signal from the pad unit PAD.

The cathode 140 is integrally formed over the entirety of the active area AA, as opposed to the anode 111 formed on a subpixel SP basis. It is important for the cathode 140 to maintain low resistance in order to maintain uniform potential without difference depending on a position for stable operation of the organic light-emitting device OLED.

In addition, the cathode 140 must be realized as a thin film in order to maintain high transmittance. However, transition metals, such as silver (Ag), tend to aggregate when being formed as a thin film, and surface properties are non-uniform and thus direct application to the display device is difficult. For this reason, a method of forming the cathode using a mixture of a transition metal and a metal other than the transition metal may be considered. In this case, however, the other metal may have higher resistance and lower transmittance than the transition metal.

In order to simultaneously secure high transmittance and low resistance that the cathode 140 must have, the display device according to the present disclosure is configured such that the cathode 140 is made of a mixture of a fullerene and a transition metal, rather than a single transition metal material.

Meanwhile, as shown in FIGS. 1 and 2, a method of manufacturing a display device according to the present disclosure may include providing an anode 111 at each of a plurality of light-emitting portions E (E1, E2, and E3) of a substrate, providing emissive layers 132a, 132b, and 132c on the respective anodes 111, and co-depositing a transition metal and a fullerene on the substrate including the emissive layers 132a, 132b, and 132c to provide a cathode 140.

Hereinafter, fullerenes used in the cathode according to the present disclosure will be described.

Figure 3A:
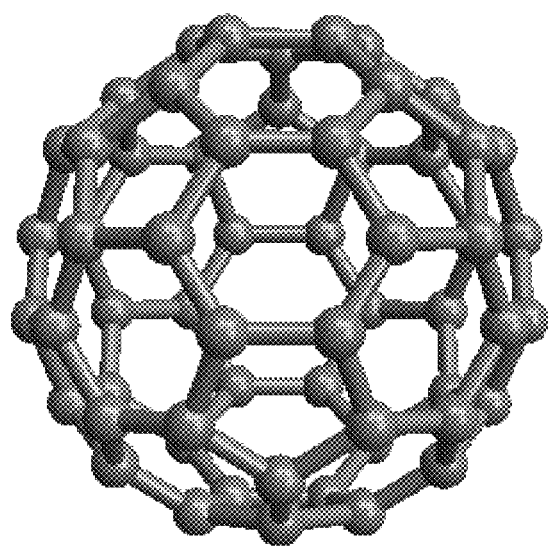
FIG. 3A illustrates an example of fullerene C60 that may be included in a cathode component of FIG. 2.
Figure 3B:
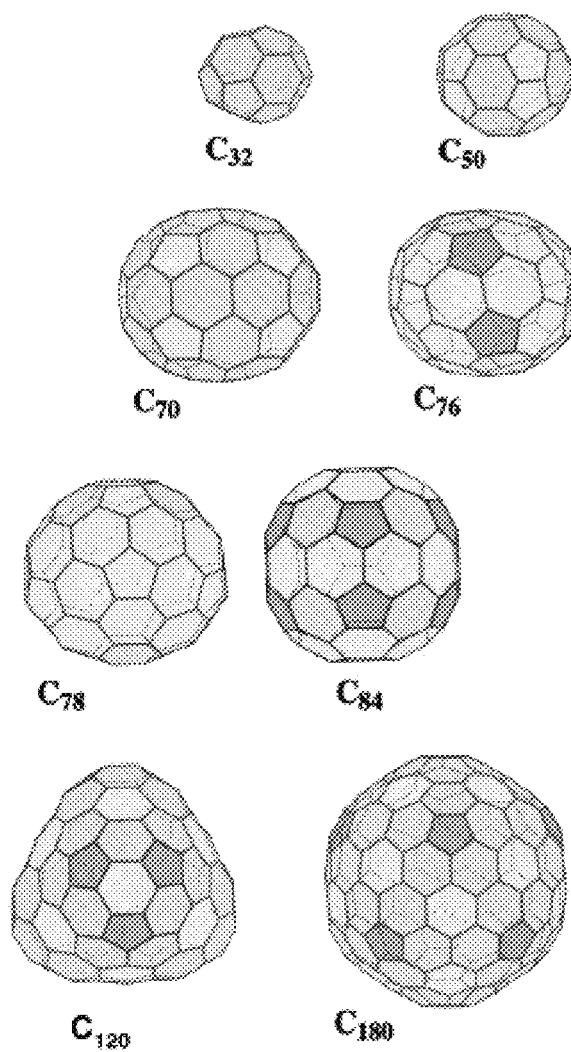
FIG. 3B illustrate various examples of fullerenes.

FIG. 3A illustrates an example of a fullerene, C60, that may be included in a cathode 140 of FIG. 2, and FIG. 3B illustrates various examples of fullerenes. FIGS. 5A to 5D illustrate examples of various complexes formed between a transition metal and a fullerene used in the cathode 140 of FIG. 2.

As shown in FIGS. 3A and 3B, a fullerene is an aggregate of carbon, is an organic material, and has a cubic shape, such as a spherical shape, an oval shape, or a shape similar to the spherical shape, whereby the fullerene is stable. Pentagonal or hexagonal carbon combination structures are repeated on the cubic surface of the fullerene, and carbon is disposed at each vertex of a pentagon or hexagon.

Since the carbon combination structures are not biased to one side, the fullerene has high stability due to structural symmetry and delocalized π electron properties resulting from the spherical shape or the oval shape.

As shown in FIG. 3A, a representative example of the fullerene may be C60. However, the fullerene used as a component of the cathode of the display device according to the present disclosure is not limited thereto, and may be changed to other structures having different carbon numbers in addition to C60 as long as the fullerene is a spherical or oval carbon aggregate having delocalized π electron properties while having a number of carbon atoms of 20 (i.e., C20) or more. For example, it is possible to realize the fullerene using a carbon aggregate having a number of carbon atoms of 20 or more, such as C20, C24, C28, and C32.

FIG. 3B shows examples of the fullerenes having a carbon number different from C60, such as C32, C50, C70, C76, C78, C84, C120, and C180. The number of hexagonal or pentagonal combination structures provided on the spherical or oval surface of the fullerene may be changed depending on the change in carbon number of the fullerene. In addition, the cubic shape of the fullerene may be slightly changed depending on orbital combination properties even in the case of the same carbon number.

Figure 4:
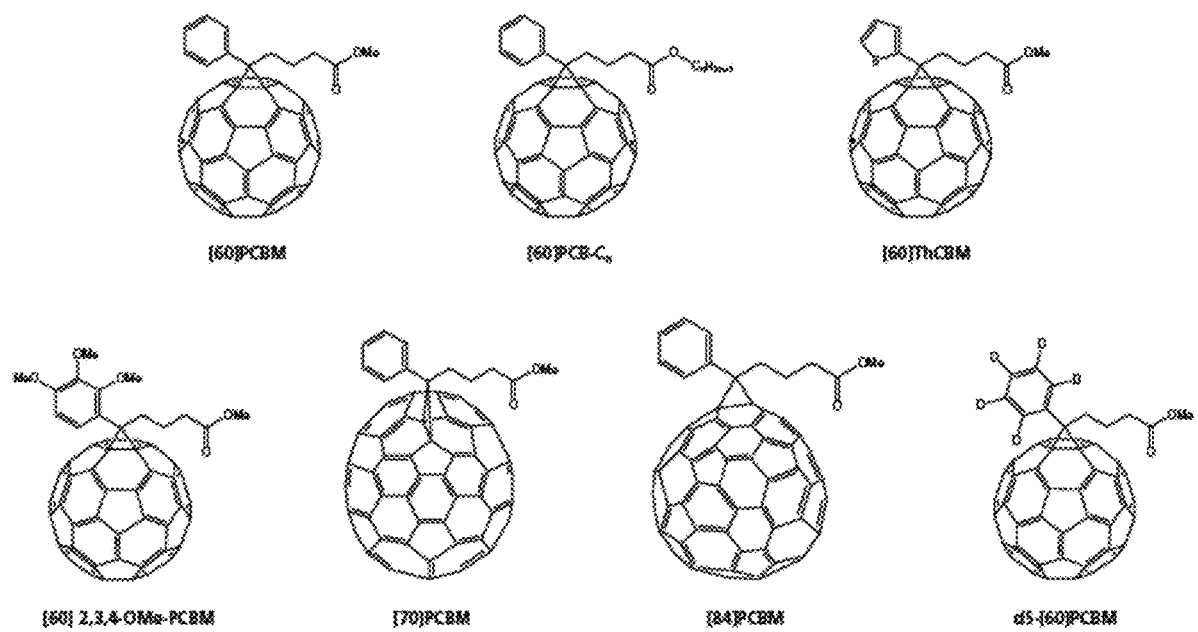
FIG. 4 illustrates structures of fullerene derivatives that may be included in the cathode component of FIG. 2.

In addition, FIG. 4 shows fullerene derivatives, which have high electron mobility.

A fullerene derivative including a predetermined functional group as an isomer, such as PCBM ([6, 6]-phenyl C61 butyric acid methyl ester) as well as C60 as a single fullerene may be used as a component included in the cathode according to the present disclosure.

In cases in which a fullerene derivative is included to form a complex with a transition metal in order to form a cathode, as described above, it is possible to improve electron injection properties of the cathode. Depending on circumstances, in cases in which the cathode includes an organic material such as a fullerene derivative, and the electron injection property of the fullerene derivative is high, it is possible to realize an organic light-emitting device with omission of the electron injection layer 134 of FIG. 2. In this case, the cathode 140 may directly abut the electron transport layer 133.

Meanwhile, the cathode may be formed by co-depositing an organic fullerene material and a transition metal, and the material is supplied such that the content of the transition metal is greater than the content of the organic fullerene material, preferably the ratio of the transition metal to the organic fullerene material is 10:1 to 20:1. After the cathode is formed, the fullerene may be included in a content of 5 vol % to 10 vol % of the total volume of the cathode.

The transition metal controls transmittance of the cathode 140, and thus must be included in a larger amount than the fullerene or the fullerene derivative in consideration of optical functions thereof. The transition metal is a main component of the cathode 140, and the fullerene or the fullerene derivative may be included in the transition metal as a dopant.

In the display device according to the present disclosure shown in FIG. 2, light emitted from the emissive layers 132a, 132b, and 132c is resonated and reflected between the anode 111 and the cathode 140, and is then transmitted through the cathode 140. To this end, the anode 111 may include a reflective metal, such as Al, an Al alloy, Ag, an Ag ally, Mg, an Mg ally, or APC (Ag—Pd—Cu). In addition, the cathode 140 includes a transition metal having transflectivity so as to finally transmit light.

The transition metal used in the cathode 140 may include at least one of scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), or gold (Au).

Figure 5A:
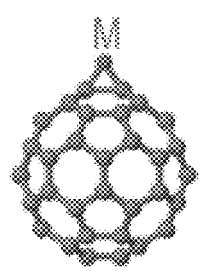
FIGS. 5A to 5D are views showing examples of various metal complexes formed between a transition metal and a fullerene used in the cathode of FIG. 2.
Figure 5B:
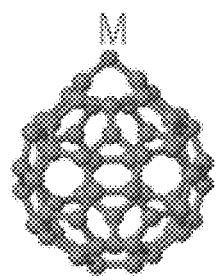
Figure 5C:
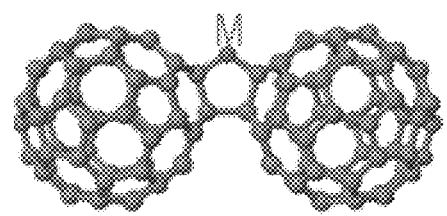
Figure 5D:
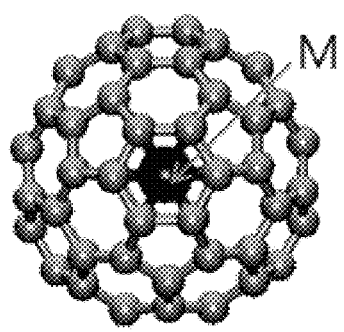

Meanwhile, in cases in which the transition metal M and the fullerene are co-deposited to form a cathode 140 as a thin film, carbon atoms in the fullerene may be complexed with the transition metal M, as shown in FIG. 5A, or on-site carbon may break double combination and may be complexed with the transition metal M, as shown in FIG. 5B. In addition, as shown in FIG. 5C, the transition metal M may be located between fullerene monomers, and therefore carbon atoms in the fullerene monomers may be complexed with the transition metal M. Furthermore, as shown in FIG. 5D, the transition metal M may be introduced into the cubic structure of the fullerene and may be complexed with at least one carbon atom on the surface of the fullerene.

Meanwhile, complexation between the fullerene derivative and the transition metal shown in FIG. 4 may be complexation between a functional group of the fullerene derivative and the transition metal, complexation between at least one carbon atom on the surface of the fullerene derivative and the transition metal, or complexation between the transition metal introduced into the cubic structure of the fullerene derivative and carbon atom(s) therearound.

In the display device according to the present disclosure, as described above, the cathode is formed through complexation between the fullerene and the transition metal, whereby it is possible to prevent an aggregation phenomenon that occurs when the transition metal alone is used to form a single film. Consequently, surface stabilization and reliability are improved, and at the same time the transition metal is included as a main component of the cathode, whereby it is possible to maintain low resistance of the transition metal. Meanwhile, carbonate carbide generated in the cathode 140 as the result of complexation between the carbon atoms and the transition metal may vary depending on the content of the fullerene.

The display device according to the present disclosure is realized such that each light-emitting portion has a strong cavity effect, and the thicknesses of the emissive layers 132a, 132b, and 132c may be different from each other in order to achieve the optimum resonance effect between the anode 111 and the cathode 140.

Hereinafter, the meaning of a cathode constituted by a mixture of a transition metal and a fullerene or a fullerene derivative will be described through various experiments.

In the following experimental examples, Ag was used as the transition metal, and experiments were carried out in the case in which a component mixed with the transition metal is a metal other than the transition metal and in the case in which a component mixed with the transition metal is an organic material of fullerene C60.

In a first experiment example and a second experiment example, Mg was used as the other metal, and therefore the cathode was made of AgMg. In the first experiment example, the thickness of the cathode thin film was 140 Å. In the second experiment example, the thickness of the cathode thin film was 80 Å.

In a third experiment example and a fourth experiment example, fullerene C60 was included in Ag, and therefore the cathode was made of Ag—C60. In the third experiment example, the thickness of the cathode thin film was 140 Å. In the fourth experiment example, the thickness of the cathode thin film was 80 Å.

Figure 6:
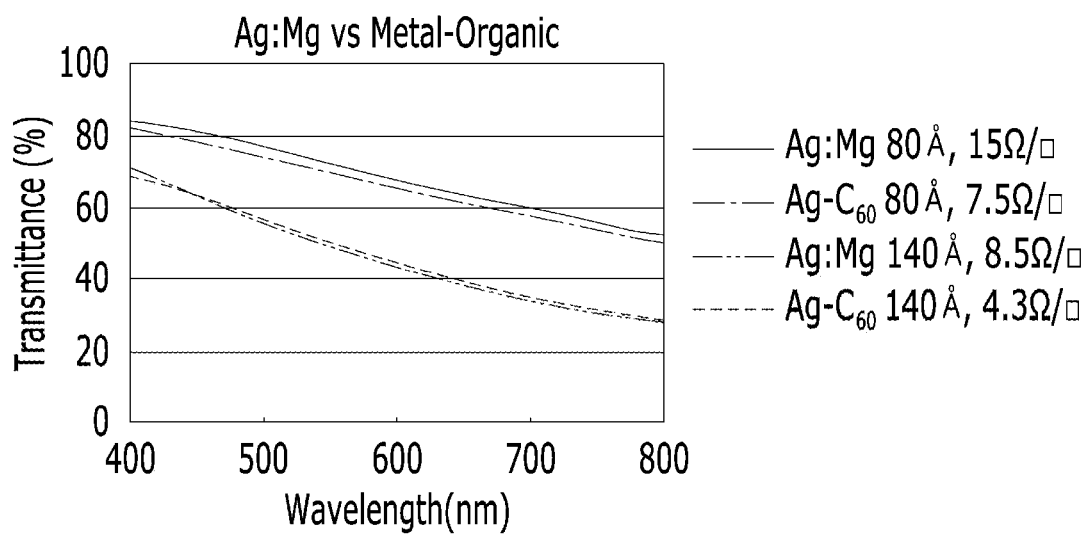
FIG. 6 is a graph showing a change in transmittance as a function of wavelength based on the thickness and component of the cathode in the structure of FIG. 2.

FIG. 6 is a graph showing a change in transmittance as a function of wavelength based on the thickness and component of the cathode in the structure of FIG. 2.

As shown in FIG. 6, transmittance in visible light bandwidth depends on the thickness of the cathode thin film. It can be seen that, in the case in which the thickness of the cathode thin film was 80 Å in the second and fourth experiment examples, transmittance was improved by about 20% or more, compared to the case in which the thickness of the cathode thin film was 140 Å in the first and third experiment examples.

This is meaningful in the structure of FIG. 2 in which the cathode thin film is used as the light emission side. The cathode 140 is an electrode located at the light emission side, and transmittance at a predetermined level or higher must be optically secured. To this end, it is important to form the cathode 140 as a thin film, and it can be expected that, as the thickness of the cathode 140 decreases, transmittance increases.

However, as shown in FIG. 6, in the first experimental example in which the thickness of the cathode thin film was 140 Å, sheet resistance was 8.5Ω/□ when the component co-deposited with Ag was a metal such as Mg, and in the third experimental example in which the thickness of the cathode thin film was 140 Å, sheet resistance was 4.3Ω/□ when the component co-deposited with Ag was fullerene C60.

Also, in the second experimental example in which the thickness of the cathode thin film was 80 Å, sheet resistance was 15Ω/□ when the component co-deposited with Ag was a metal such as Mg, and in the fourth experimental example in which the thickness of the cathode thin film was 80 Å, sheet resistance was 7.5Ω/□ when the component co-deposited with Ag was fullerene C60.

It can be seen from FIG. 6 that the AgMg cathode thin film made of a mixture of Ag and the other metal has a greater sheet resistance under the same thickness condition than that of the cathode thin film made of a mixture of Ag and fullerene C60 and that the AgMg cathode thin film having a thickness of 140 Å (the first experimental example) has a greater sheet resistance than that of the Ag—C60 cathode thin film having a thickness of 80 Å (the fourth experimental example). That is, it can be seen that, in the case in which the cathode is made of a mixture of a transition metal and fullerene C60, as in the display device according to the present disclosure, transmittance of 60% or more is secured in the visible light bandwidth and it is possible to secure low sheet resistance even under a thinner film condition.

Figure 7:
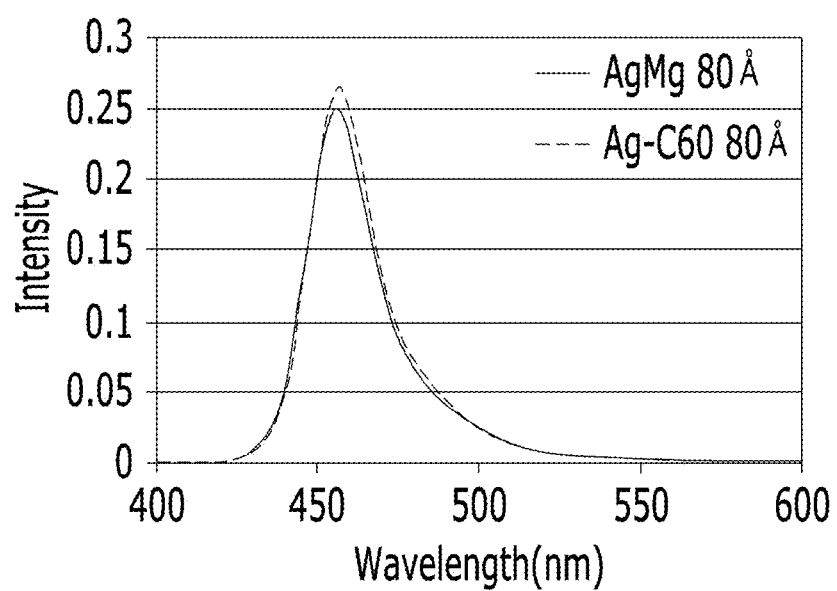
FIG. 7 is a graph showing the EL spectrum properties of a blue light-emitting portion when AgMg and Ag—C60 are used as the cathode.
Figure 8:
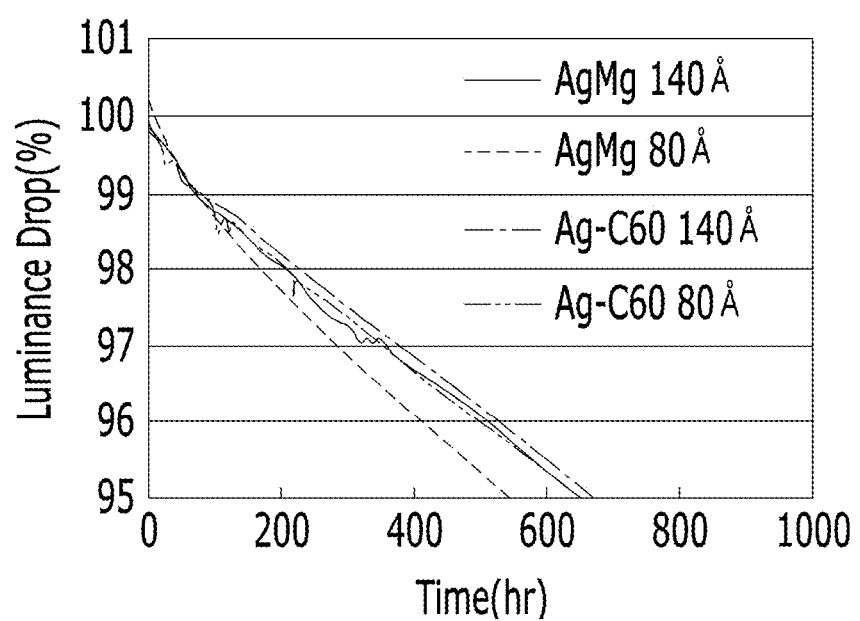
FIG. 8 is a graph showing lifespan properties when each of AgMg and Ag—C60 has thicknesses of 140 Å and 80 Å.

FIG. 7 is a graph showing the EL spectrum properties of a blue light-emitting portion when AgMg and Ag—C60 are used as the cathode, and FIG. 8 is a graph showing lifespan properties when each of AgMg and Ag—C60 has thicknesses of 140 Å and 80 Å. In each experimental example, experiments were carried out in the state in which only the cathode of the display device of FIG. 2 was changed. Here, current density was 5 mA/cm$^2$. In the third and fourth experimental examples, C60 included in the cathode was doped in 5 vol %.

The electrical and optical properties of blue light in the first to fourth experimental examples will be described with reference to FIG. 7 and Table 1.

Driving voltage tends to increase as the thin film becomes thinner, and the difference is slight and similar in the experimental examples.

Particularly, however, in the two experimental examples using Ag—C60 as the cathode (the third and fourth experimental examples), it can be seen that luminance is improved in the fourth experimental example having a thinner film.

Also, as shown in FIG. 7, in the two experimental examples having the same thin film condition (the second and fourth experimental examples), it can be seen that the intensity of a blue wavelength increases in the fourth experimental example using Ag—C60.

In contrast, it can be seen that efficiency difference occurs at the time of forming the thin film when the cathode is formed using AgMg in the first and second experimental examples.

TABLE 1

| | Electrical and optical properties | | | | |
|---|---|---|---|---|---|
| Classification | Driving voltage (V) | Luminance (Cd/A) | CIEx | CIEy | Light emission peak (nm) |
| First experimental example (AgMg 140 Å) | 7.5 | 194 | 0.140 | 0.059 | 458 |
| Second experimental example (AgMg 80 Å) | 7.4 | 187 | 0.142 | 0.059 | 456 |
| Third experimental example (Ag-C60 140 Å) | 7.7 | 192 | 0.141 | 0.054 | 458 |
| Fourth experimental example (Ag-C60 80 Å) | 7.6 | 194 | 0.141 | 0.060 | 456 |

The most effective point when the cathode is formed using Ag—C60 according to the present disclosure is a lifespan. As shown in FIG. 8, it can be seen that in the second experimental example using the AgMg metal having a thickness of 80 Å, the lifespan until luminance reaches 95% of initial luminance is reduced by 60 hours or more compared to the first, third, and fourth experimental examples. In contrast, it can be seen that there is little lifespan difference due to a change in thickness in the third and fourth experimental examples using Ag—C60 as the cathode. When the cathode is formed using a mixture of a transition metal and a fullerene organic material, such as Ag—C60, therefore, it can be seen that efficiency is not deteriorated while the lifespan is not reduced even in the case in which the cathode is formed as a thin film.

Hereinafter, a change in driving voltage based on current density in the first to fourth experimental examples will be described.

Figure 9A:
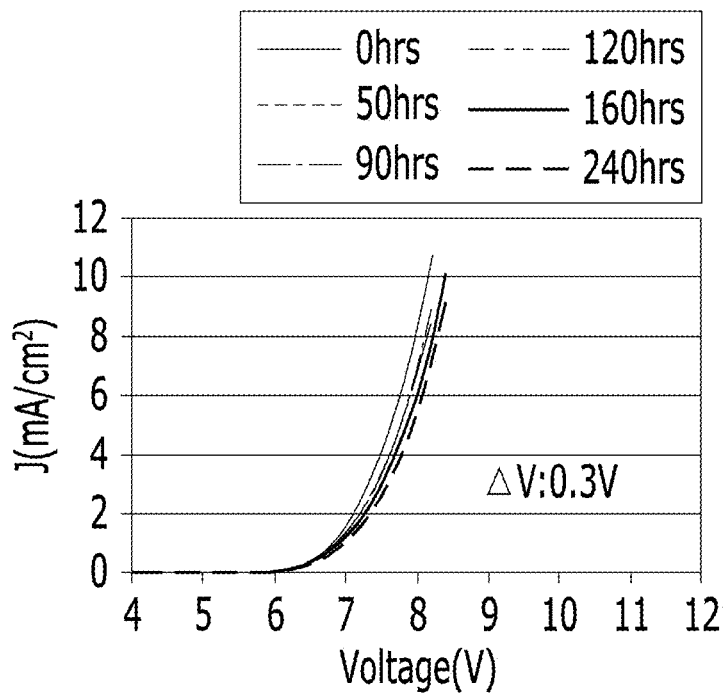
FIGS. 9A and 9B are graphs showing effects of cathode thickness on J-V properties when AgMg is used as the cathode.
Figure 9B:
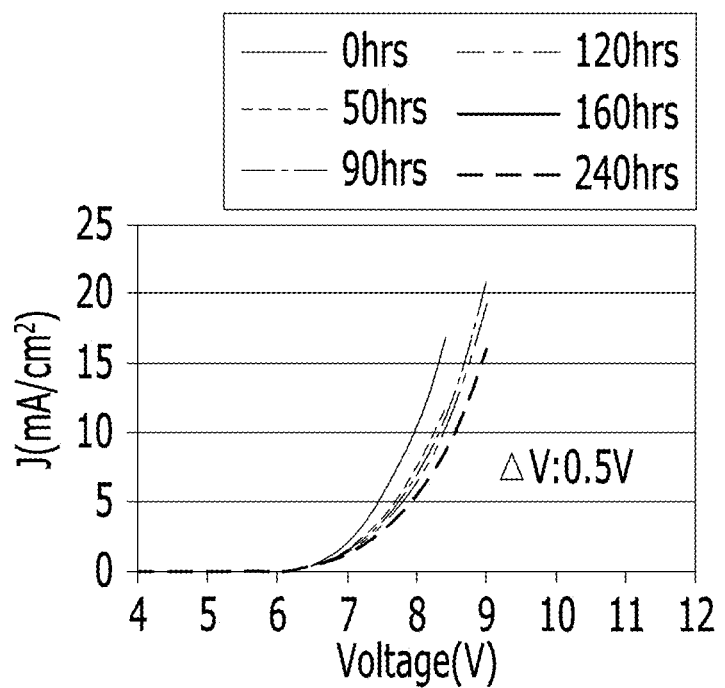
Figure 10A:
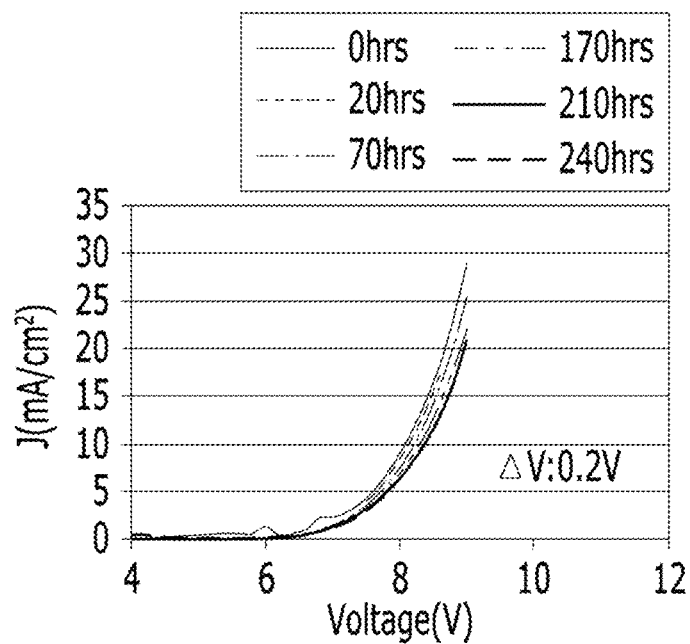
FIGS. 10A and 10B are graphs showing effects of cathode thickness on J-V properties when Ag—C60 is used as the cathode.
Figure 10B:
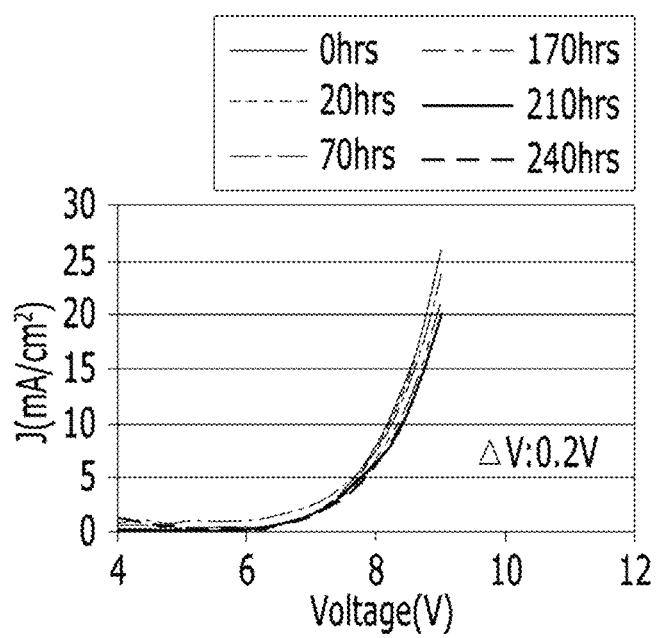

FIGS. 9A and 9B are graphs showing effects of cathode thicknesses on J-V properties when AgMg is used as the cathode, and FIGS. 10A and 10B are graphs showing effects of cathode thicknesses on J-V properties when Ag—C60 is used as the cathode.

As shown in FIGS. 9A and 9B and Table 2, the display devices according to the first and second experimental examples were driven at a current density of 5 mA/cm$^2$ at a temperature of 100° C., and it can be seen that driving voltages were increased by 0.3 V and 0.5 V, respectively, after 240 hours.

In contrast, as shown in FIGS. 10A and 10B and Table 2, the display devices according to the third and fourth experimental examples were driven at a current density of 5 mA/cm$^2$ at a temperature of 100° C., and it can be seen that all driving voltages were increased by 0.2 V after 240 hours, whereby the reliability of the display device at high temperature was improved in the third and fourth experimental examples using Ag—C60 as the cathode.

TABLE 2

| Classification (high-temperature storage for 240 hours) | Electrical and optical properties | | | | |
| --- | --- | --- | --- | --- | --- |
| | Driving voltage (V) | Luminance (Cd/A) | CIEx | CIEy | ΔV |
| First experimental example (AgMg 140 Å) | 7.8 | 211 | 0.140 | 0.062 | 0.3 |
| Second experimental example (AgMg 80 Å) | 7.9 | 230 | 0.136 | 0.070 | 0.5 |
| Third experimental example (Ag-C60 140 Å) | 7.9 | 213 | 0.145 | 0.053 | 0.2 |
| Fourth experimental example (Ag-C60 80 Å) | 7.8 | 234 | 0.147 | 0.045 | 0.2 |

Hereinafter, a change in transmittance during high-temperature storage in the third experimental example and the fourth experimental example will be described.

Figure 11A:
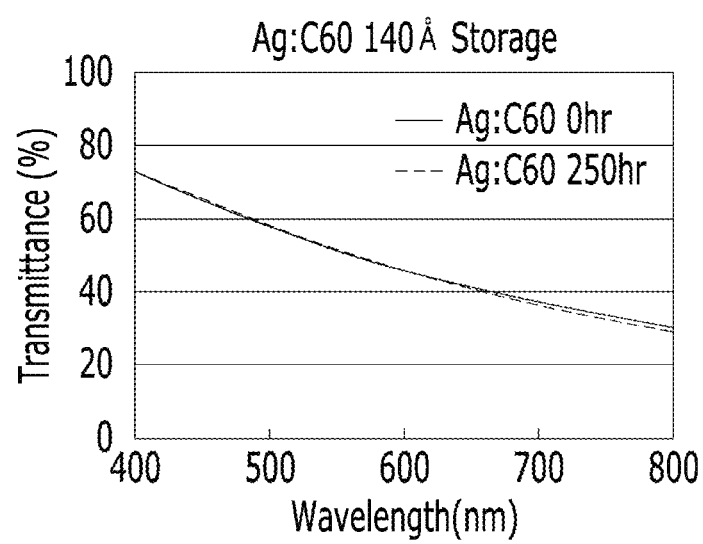
FIGS. 11A and 11B are graphs showing a change in transmittance as a function of wavelength during high-temperature storage when Ag—C60 has thicknesses of 140 Å and 80 Å.
Figure 11B:
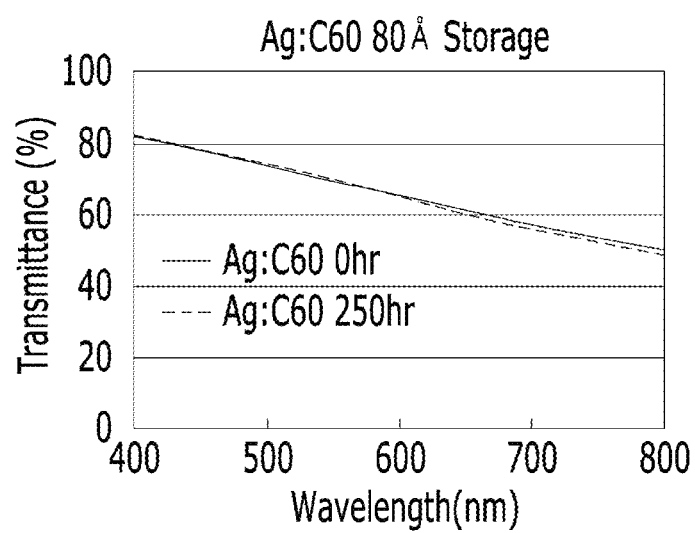

FIGS. 11A and 11B are graphs showing a change in transmittance as a function of wavelength during high-temperature storage when Ag—C60 has thicknesses of 140 Å and 80 Å.

It was confirmed from FIG. 6 that transmittance in a normal state in the case in which the cathode is realized as a thinner film using Ag—C60, as in the fourth experimental example (Ag—C60 80 Å) is higher than that in the third experimental example (Ag—C60 140 Å).

In addition, it can be seen from FIGS. 11A and 11B that a change in inclination of transmittance during high-temperature storage in the fourth experimental example is smaller than that in the third experimental example, and therefore it is possible to confirm that an Ag—C60 cathode formed as a thinner film has stability during high-temperature storage.

It was confirmed through experiments that, in the case in which a mixture of a transition metal and a fullerene (e.g., Ag—C60) is used as the cathode, as described above, the display device according to the present disclosure has advantages of high transmittance, low resistance, high-temperature stability, and improved efficiency within a thickness range of 80 Å to 140 Å.

Meanwhile, as the thickness of the cathode 140 decreases, transmittance increases. In the case in which the cathode has a thickness less than 80 Å, this is advantageous in terms of high transmission. However, since the cathode is formed by co-depositing a mixture of a transition metal and a fullerene or a fullerene derivative in the display device according to the present disclosure, the thickness of the cathode is set to 50 Å or more in taking into consideration of uniformity in thickness and reliability in process. The inventors of the present application have found that, when the Ag—C60 cathode is formed to have a thickness of 50 Å to 140 Å, the Ag—C60 cathode has higher transmittance, lower resistance, and higher efficiency than the AgMg cathode having a thickness of 140 Å (the first experimental example).

Hereinafter, a display device according to another embodiment of the present disclosure will be described.

Although the display device according to the first embodiment described above is configured such that each subpixel has a light-emitting portion E, the present application may not be limited to the first embodiment due to various requirements of the display device.

Hereinafter, a transparent display device capable of viewing the rear surface thereof, like transparent glass, will be described.

Figure 12:
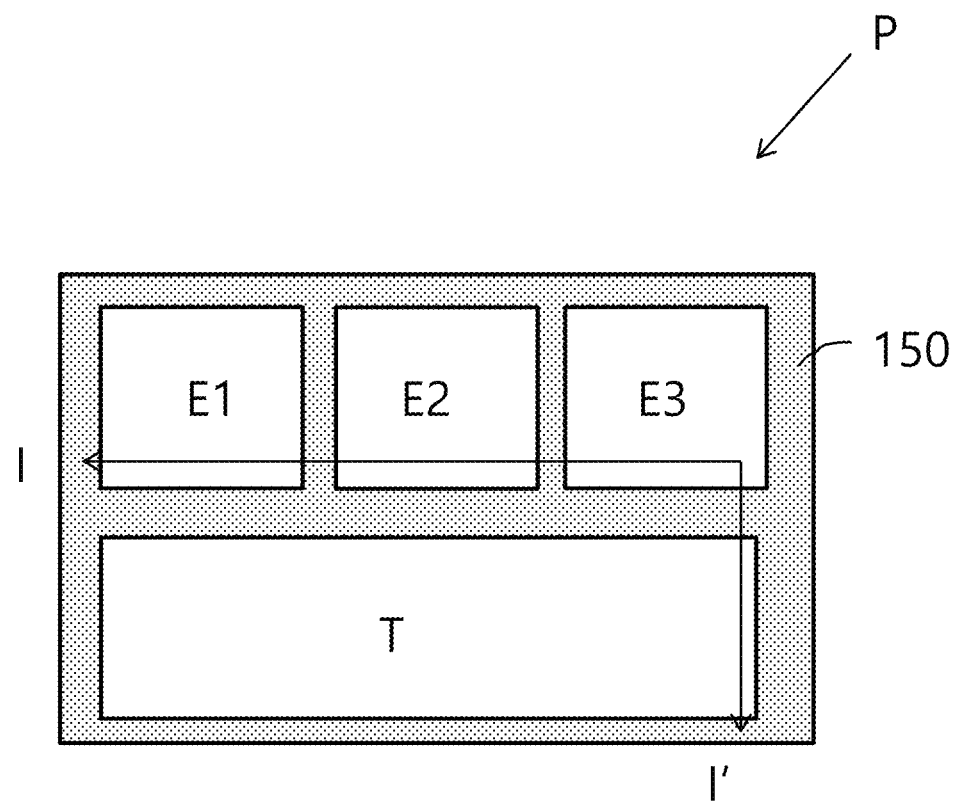
FIG. 12 is a plan view showing a display device according to a second embodiment of the present disclosure.
Figure 13:
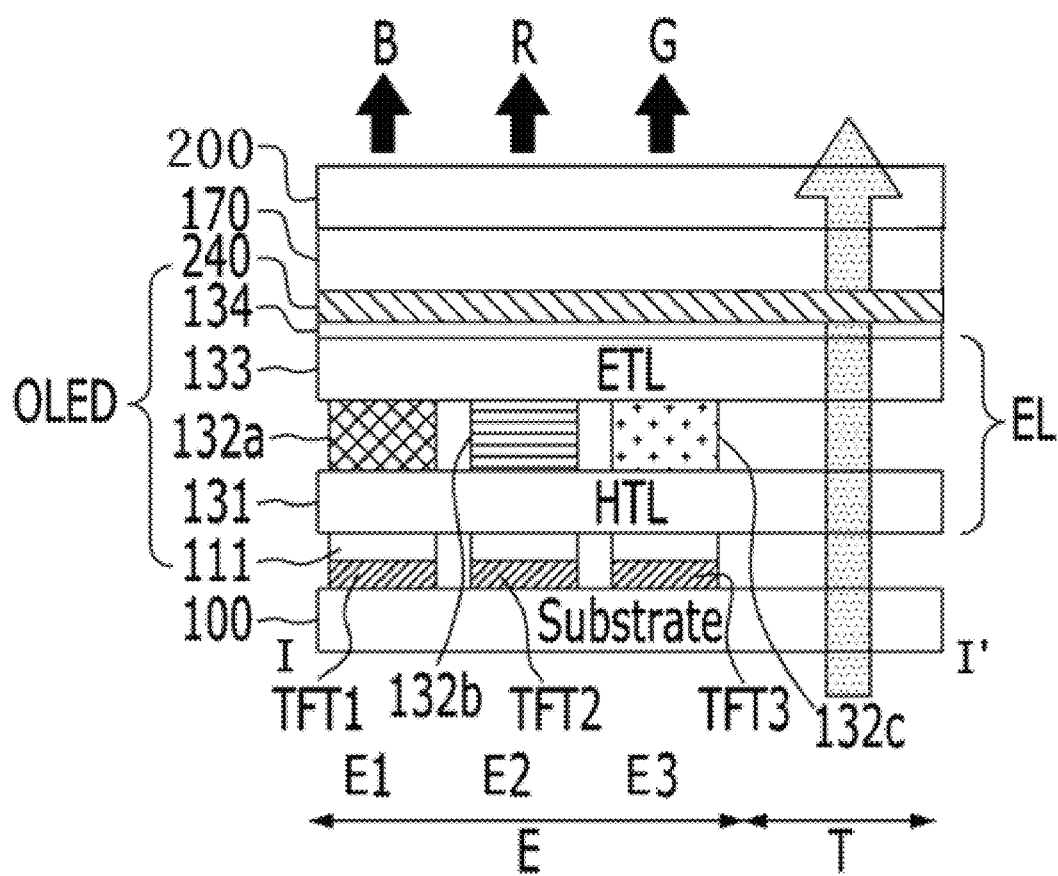
FIG. 13 is a sectional view taken along line I-I' of FIG. 12.

FIG. 12 is a plan view showing a display device according to a second embodiment of the present disclosure, and FIG. 13 is a sectional view of FIG. 12.

As shown in FIGS. 12 and 13, the display device according to the second embodiment of the present disclosure is configured such that a pixel P has first to third light-emitting portions E1, E2, and E3, each of which may be a subpixel, and a transmission unit T as a single set and a plurality of pixels is provided in an active area AA (see FIG. 1) in a matrix format.

The display device according to the second embodiment of the present disclosure is different from the display device according to the first embodiment in that the transmission unit T is further provided on a substrate 100. Consequently, the construction of the light-emitting portions E1, E2, and E3 is identical to that of the display device according to the first embodiment. The substrate having the transmission unit T is transparent to the extent to which the construction of the rear surface thereof is visible, and may be, for example, a transparent plastic film or a glass substrate.

Thin film transistors TFT1, TFT2, and TFT3, an anode 111, and emissive layers 132a, 132b, and 132c are not provided in the transmission unit T, whereby light passing through the substrate 100 may be directly emitted through a cathode 240, compared to the construction of the light-emitting portions E (E1, E2, and E3).

Each pixel P may have a single light-emitting portion E and a single transmission unit T as a set, or may have a light-emitting portion E including blue, red, and green light-emitting portions E1, E2, and E3 capable of expressing white through combination thereof in each pixel and a single transmission unit T as a set, as shown.

The light-emitting portions E (E1, E2, and E3) and the transmission unit T may be disposed in different rows so as to be parallel to each other, as shown, or may be disposed in different columns so as to be parallel to each other. Each of the light-emitting portions E (E1, E2, and E3) and the transmission unit T is shown as having a quadrangular shape. However, the present disclosure is not limited thereto. Each of the light-emitting portions and the transmission unit may have a polygonal shape other than the quadrangular shape, an oval shape, or a shape in which at least some of the corners are round. Depending on circumstances, corners of the light-emitting portions E (E1, E2, and E3) and the transmission unit T may be disposed so as to neighbor each other while being spaced apart from each other by a predetermined distance.

In addition, the light-emitting portions E (E1, E2, and E3) and the transmission unit T may have different shapes. The size of the light-emitting portions E1, E2, and E3 configured to emit different colors may be changed depending on intended color properties of the display device.

In order to improve transmittance of the display device, the size of a single transmission unit T may be greater than the size of at least a single light-emitting portion E1, E2, or E3.

Meanwhile, a bank 150 is provided around the light-emitting portions E (E1, E2, and E3) and the transmission unit T to define the same. The bank 150 may overlap a portion of the edge of the anode 111.

In addition, a light-emitting device OLED (see FIG. 13) including emissive layers 132a, 132b, and 132c is provided between the light-emitting portions E (E1, E2, and E3) and an electrode that faces the light-emitting portions, but the transmission unit T may have no light-emitting device. Some components of the emissive layers, such as a hole transport layer 131 and an electron transport layer 133, may also be provided in the transmission unit T.

An organic light-emitting device OLED constituted by a stack of an anode 111, a hole transport layer (HTL) 131, emissive layers 132a, 132b, and 132c, an electron transport layer 133, an electron injection layer 134, and a cathode 240 is provided at the light-emitting portions E (E1, E2, and E3).

Among components of an organic stack EL, the hole transport layer 131, the electron transport layer 133, and the electron injection layer 134 are continuously formed over the light-emitting portions E (E1, E2, and E3) and the transmission unit T.

Also, in the display device according to the second embodiment of the present disclosure, the cathode 240 has the same shape as the cathode 140 of FIG. 1, and is configured to overlay the entirety of the active area AA. As a result, the cathode 240 is also formed in the transmission unit T. Meanwhile, in the display device according to the present disclosure, a mixture of a transition metal and a fullerene or a mixture of a transition metal and a fullerene derivative is applied, whereby it is possible to form the cathode 240 as a thin film having a thickness of 50 Å to 140 Å, and therefore it is possible to maintain high transmittance and low resistance even though the cathode is formed in the transmission unit T.

A capping layer 170 is formed so as to protect the cathode 240, and may have an area equal to or greater than the area of the cathode 240. An encapsulation layer 200 is configured so as to completely overlay or cover the organic light-emitting device OLED in order to prevent external moisture permeation and to protect the organic light-emitting device OLED, and may extend from the other sides thereof excluding the pad unit PAD to the outer edge of the substrate 100 so as to have a larger area than the cathode 240, as shown in FIG. 1.

Meanwhile, in the display device according to the second embodiment of the present disclosure, the cathode 240 is formed so as to overlap the non-active area NA by a predetermined width at the boundary of the active area AA, as indicated by 140 of FIG. 1, and the top and side of the cathode are protected by the encapsulation layer 200 extending further outwards than the cathode.

Hereinafter, sheet resistance, a change in voltage $\Delta Vss$, and high-temperature reliability of the cathode in a fifth experimental example (AgMg) and a sixth experimental example (Ag—C60) in which the cathode is formed so as to have a thickness of 140 Å in order to secure low resistance in a large area while changing the cathode component will be described.

Also, in each experimental example, the area of the transmission unit described in connection with the second embodiment was adjusted to 55% and 65% for each pixel in order to measure transmittance of the transmission unit.

Figure 14:
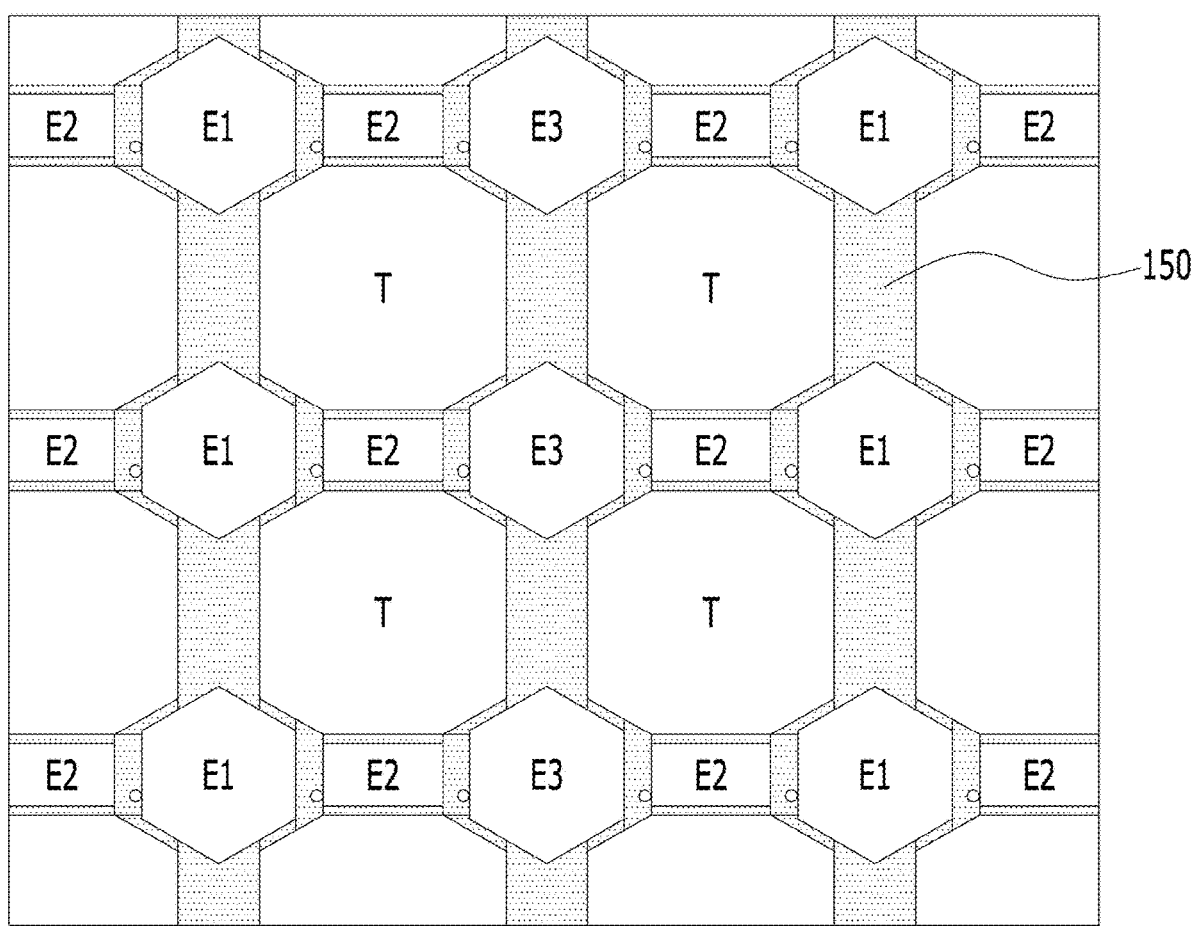
FIG. 14 is a plan view showing a display device according to a third embodiment of the present disclosure.

FIG. 14 is a plan view showing a display device according to a third embodiment of the present disclosure.

As shown in FIG. 14, in the display device according to the third embodiment of the present disclosure, each transmission unit T may be formed in a shape in which corners of an imaginary quadrangle are cut, i.e., in an octagonal shape having eight sides. In addition, first light-emitting portions E1 may neighbor two of four sides inclined relative to the X axis, and third light-emitting portions E3 may neighbor the other two sides.

In addition, second light-emitting portions E2 may be located between the first and third light-emitting portions E1 and E3 so as to neighbor the sides of the transmission unit T parallel to the X axis.

The first to third light-emitting portions E1, E2, and E3 provided around the transmission unit T may emit different colors. The area of the first and third light-emitting portions E1 and E3 that may be each a subpixel, may be greater than the area of the second light-emitting portions E2. The reason for this is that there may be colors of emission light having weight depending on intended color expression of the display device. The first and third light-emitting portions E1 and E3 may be hexagonal, and the second light-emitting portions E2 may be rectangular.

A bank 150 may be provided between the light-emitting portions E1, E2, and E3 and the transmission unit T.

In the third embodiment of the present disclosure, the cathode 240 is provided so as not overlap the area of the transmission unit T.

In this case, the cathode 240 may have the same transmittance depending on the area of the aperture ratio of the transmission unit T to the substrate 100.

FIG. 15A is a sectional view showing the structure of the display device used in each of the fifth and sixth experimental examples.

As shown in FIG. 15A, in the large-area display device according to each of the fifth and sixth experimental examples, the encapsulation layer 200 (see FIG. 130) had a three-layer structure including a first inorganic encapsulation film 201a, an organic encapsulation film 202, and a second inorganic encapsulation film 203, which were made of SiNx, PCL, and SiNx, respectively.

In addition, the electron injection layer of the fifth experimental example was a layer of a mixture of Yb:LiF and had a thickness of 30 Å, and the electron injection layer of the sixth experimental example was a single layer of Yb and had a thickness of 15 Å.

The other components of the display devices according to the fifth and sixth experimental examples, excluding the materials of the cathode 240a and the electron injection layer 134, were identical to each other.

TABLE 3

|  |  | Fifth experimental example | Sixth experimental example |
|---|---|---|---|
| Cathode | Material | AgMg | Ag-C60 [95 vol %:5 vol %] |
|  | Thickness | 140 Å | 140 Å |
| Electron injection layer | Material | Yb:LiF | Yb |
| Encapsulation layer |  | SiNx/PCL/SiNx | |
| Transmittance (at 550 nm) | Cathode transmittance | 65% | 65% |
|  | Panel transmittance (aperture ratio of 55%) | 28.0% | 28.0% |
|  | Panel transmittance (aperture ratio of 65%) | 35.0% | 35.0% |
| Sheet resistance (Ω/□) |  | 8.5 | 4.3 |
| ΔVss (V) |  | 0.57 | 0.35 |
| High-temperature reliability (100° C./storage for 240 hours): Voltage shift |  | Δ0.3 V | Δ0.2 V |

It can be seen from Table 3 that, in the sixth experimental example, the sheet resistance was low and both the cathode voltage volatility ΔVss and the high-temperature reliability were excellent as the result of using the mixture of the transition metal and the fullerene even in the same thickness condition, compared to the fifth experimental example.

Hereinafter, sheet resistance, a change in voltage ΔVss. and high-temperature reliability of the cathode in a seventh experimental example (AgMg), an eighth experimental example (Ag—C60, 5 vol % of fullerene), and a ninth experimental example (Ag—C60, 8 vol % of fullerene) in which the cathode is formed to have a thickness of 80 Å in order to achieve high transmittance while varying the cathode component will be described.

Also, in each experimental example, the area of the transmission unit described in connection with the second embodiment was adjusted to 55% and 65% for each pixel in order to measure transmittance of the transmission unit.

FIG. 15B is a sectional view showing the structure of a display device used in each of seventh to ninth experimental examples.

As shown in FIG. 15B, in the high-transmission display device according to each of the seventh to ninth experimental examples, the encapsulation layer 200 (see FIG. 13) had a three-layer structure including a first inorganic encapsulation film 201b, an organic encapsulation film 202, and a second inorganic encapsulation film 203, which were made of SiON, PCL, and SiNx, respectively.

Also, in the seventh to ninth experimental examples, the electron injection layer was commonly a single layer of ytterbium (Yb) and had a thickness of 15 Å.

The other components of the display devices according to the seventh to ninth experimental examples, excluding the materials of the cathode 240b, were identical to each other.

TABLE 4

|  |  | Seventh experimental example | Eighth experimental example | Ninth experimental example |
|---|---|---|---|---|
| Cathode | Material | AgMg | Ag-C60 [95 vol %: 5 vol %] | Ag-C60 [92 vol %: 8 vol %] |
|  | Thickness | 80 Å | 80 Å | 80 Å |
| Electron injection layer | Material | Yb | Yb | Yb |
| Encapsulation layer |  |  | SiON/PCL/SiNx | |
| Transmittance | Cathode | 92.1% | 92.3% | 95.1% |
| (at 550 nm) | transmittance |  |  |  |
|  | Panel transmittance (aperture ratio of 55%) | 47.0% | 47.0% | 48.5% |
|  | Panel transmittance (aperture ratio of 65%) | 58.0% | 58.0% | 59.8% |
| Sheet resistance (Ω/□) |  | 15 | 7.0 | 12.0 |
| ΔVss (V) |  | 0.82 | 0.5 | 0.69 |
| High-temperature reliability (100° C./storage for 240 hours): Voltage shift |  | Δ0.4 V | Δ0.2 V | Δ0.4 V |

It can be seen from Table 4 that, in the eighth experimental example, the sheet resistance was low and both the cathode voltage volatility ΔVss and the high-temperature reliability were excellent as the result of using the mixture of the transition metal and the fullerene even given the same thickness condition, compared to the seventh experimental example.

Ag—C60 was used in the eighth experimental example and the ninth experimental example; however the amount of C60 as a dopant in the ninth experimental example, which was 8 vol %, was greater than that in the eighth experimental example. In this case, it can be seen that, although the transmittance was increased, sheet resistance was higher and both the cathode voltage volatility ΔVss and the high-temperature reliability were lower than in the eighth experimental example (the amount of C60 as a dopant was 5 vol %). However, all of the properties of the ninth experimental example are excellent, compared to those of the seventh experimental example.

That is, it can be expected that, in the case in which the fullerene is included in the cathode in an amount of 10 vol % or less in consideration of all of the transmittance, sheet resistance, cathode voltage volatility ΔVss, and high-temperature reliability, excellent effects are achieved, compared to the cathode constituted by a combination of a transition metal and a metal other than the transition metal (in the first, second, fifth, and seventh experimental examples).

Figure 16:
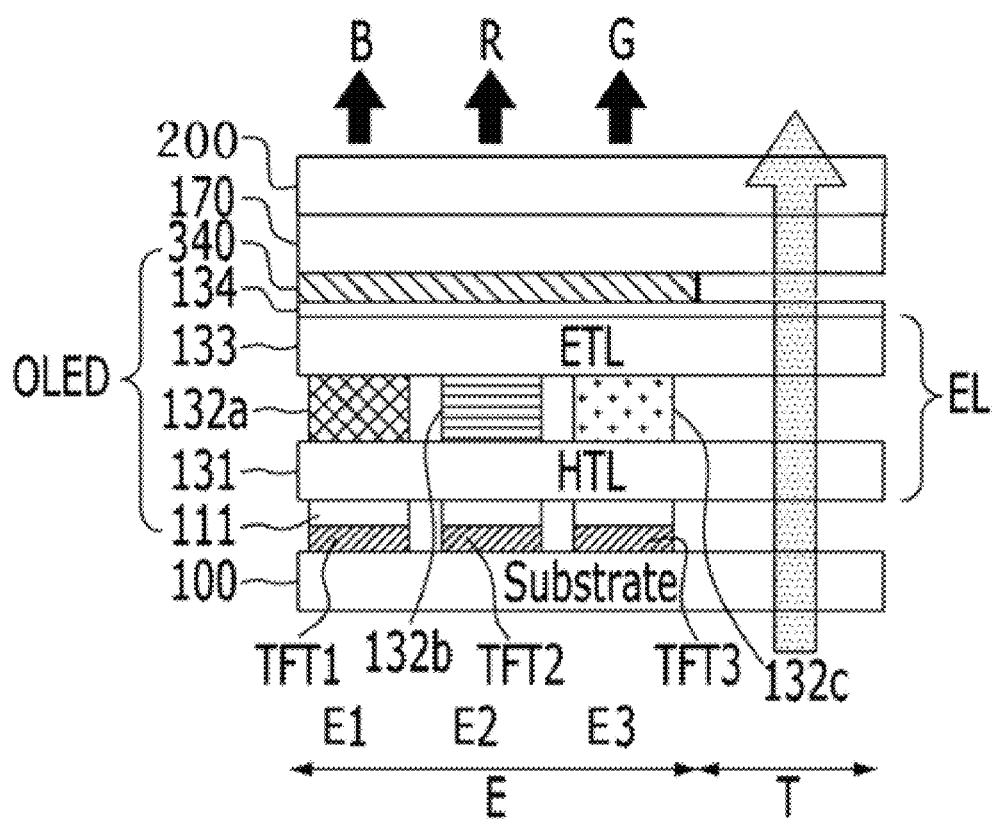
FIG. 16 is a sectional view showing a display device according a modification of to the second embodiment of the present disclosure.

FIG. 16 is a sectional view showing a modification of the second embodiment of the display device according to the present disclosure.

As shown in FIG. 16, the modification of the second embodiment of the display device according to the present disclosure is characterized in that a cathode 340 is patterned so as to be removed from a transmission unit T.

In this case, the overall outer shape of the cathode 340 is the same as what is shown in FIG. 1, and may be formed in a shape in which a portion of the transmission unit T provided in the active area AA is removed in the form of a hole. Since the cathode 340 is removed from the transmission unit T, some materials configured to absorb light may be omitted from a path along which rear light is transmitted, whereby transmittance of the transmission unit T may be increased.

In the modification of the second embodiment of the display device, the capping layer 170 may be formed so as to have a larger area than the cathode 340 in order to protect the organic light-emitting device OLED, and the encapsulation layer 200 may have a larger area than the cathode 340 and may be formed in the entirety of the active area AA and the outer edge of the non-active area NA excluding the pad unit PAD in order to protect the cathode 340.

Meanwhile, the patterned cathode 340 of FIG. 16 may be applied not only to the same transmission unit T by pixel P but also to a form in which one or more holes are formed in an area corresponding to a camera in a certain area of the substrate 100. In this case, the holes are discontinuous from the circumference thereof.

In this case, a transition metal and a fullerene (or a fullerene derivative) may be co-deposited on the substrate 100 including the emissive layers 132a, 132b, and 132c so as to overlap only the emissive layers using a mask in order to selectively form the cathode 340.

In addition, the substrate may have a hole formed in the area corresponding to the camera so as to correspond to the entirety or a portion of the thickness thereof, and the cathode may be planarly spaced apart from the hole in order to prevent moisture permeation due to the hole.

In the display device according to the present disclosure, a mixture of a transition metal and a fullerene or a fullerene derivative is formed, and the transition metal is complexed with at least one carbon constituting the fullerene or the fullerene derivative during deposition, whereby stability in deposition of the transition metal may be secured. Instead of using a metal other than the transition metal to prevent aggregation of the transition metal, the fullerene is used to form a complex with the transition metal, whereby deposition stability and reliability are improved.

In addition, the transition metal and the fullerene or the fullerene derivative are used to form the cathode, whereby it is possible to maintain high transmittance of the cathode when the cathode is used as a transmission side electrode of the display device while forming the cathode as a thin film. That is, a metal alloy is not required, whereby transmittance is excellent.

Furthermore, it is possible to secure low resistance of the transition metal and the fullerene or the fullerene derivative even in a thin film state for high transmittance. When the cathode having the mixture of the transition metal or the complex of the transition metal and the fullerene or the fullerene derivative is applied to the light-emitting device, therefore, it is possible to improve performance of the device.

In the case in which the cathode having a mixture of the transition metal and the fullerene or the fullerene derivative is applied to a large-area display device, it is possible to prevent voltage volatility of the cathode. Since a means necessary to prevent voltage drop, such as an auxiliary electrode, may be omitted, it is possible to simplify the structure.

In addition, since it is possible to prevent voltage drop by changing the compositions of only the cathode, application to various environments, such as a medium- or large-sized display device, a television, a cellular phone, and an in-vehicle mounted display device is also possible.

In addition, when an n-type isomer having high electron mobility is used as a fullerene isomer, electron injection is improved, whereby efficiency is improved.

Meanwhile, various carbon aggregates having a number of carbon atoms of 20 (i.e., C20) or more are possible as the fullerene used in the present disclosure in addition to C60, and various fullerene derivatives having different functional groups may be used.

Meanwhile, in a top emission structure that is used at the present time, an example in which the anode electrode of the light-emitting device includes a reflective metal and the cathode electrode includes a transflective metal may be applied to a top emission structure that is used at the present time. In this case, light emitted from the emissive layer located between the anode and the cathode is reflected by the reflective anode and is resonated several times between the anode and the cathode, and a specific wavelength of light is emitted depending on the distance between the anode and the cathode. In order to improve transmission efficiency in this structure, an effort to reduce the thickness of the cathode is raised.

Also, in recent years, the demand for a transparent display device configured such that light is transmitted through the front surface and the rear surface thereof and an image is displayed without disturbing a field of vision has increased.

A transparent display device according to the present disclosure is configured such that light-emitting diodes are differently disposed in a self-emissive area and a transparent area in order to simultaneously achieve transparent display and light emission display.

In the self-emissive area and the transparent area, an increase in efficiency of light emission and transmittance must be considerable in the first place. Since required structures are different from each other due to different purposes, realization is difficult using a common forming method. However, the display device according to the present disclosure solves this problem using a cathode made of new materials.

A display device according to an embodiment of the present disclosure may include an anode provided at each of a plurality of light-emitting portions of a substrate, an emissive layer provided on or over the anode, and a cathode provided above or over the emissive layers to overlap the plurality of light-emitting portions of the substrate, the cathode including a mixture of a transition metal and a fullerene complexed with the transition metal.

The fullerene may be a carbon aggregate having a number of carbons of 20 (i.e., C20) or more.

The fullerene may have a spherical shape or an oval shape.

The transition metal may be located in the spherical shape or the oval shape, the transition metal being complexed with one or more carbons of fullerene.

The transition metal may be located outside the fullerene, the transition metal being complexed with one or more carbons of fullerene.

The fullerene of the cathode may be included in a content of 10 vol % or less with respect to the cathode.

The display device may further include an electron injection layer provided between the emissive layer and the cathode, the electron injection layer including a lanthanide metal.

The transition metal may include at least one of scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), or gold (Au).

The display device may further include a capping layer configured to cover or overlay the top and the side of the cathode.

The display device may further include an inorganic encapsulation layer configured to overlay or cover the top and the sides of the capping layer.

The transition metal of the cathode may be a reflective metal.

The cathode may have a thickness of 50 Å to 140 Å.

The substrate may further have a transmission unit provided between the plurality of light-emitting portions.

The cathode may not overlap the transmission unit.

A portion of the transmission unit may correspond to a lens of a camera located at the backside of the substrate opposite to the anode.

The substrate may have a hole, the cathode being spaced apart from the hole by a predetermined distance.

The size of a single transmission unit may be greater than the size of at least a single light-emitting portion.

The size of the light-emitting portion configured to emit different colors may be changed depending on intended color properties of the display device.

A method of manufacturing a display device according to an embodiment of the present disclosure may include providing an anode at each of a plurality of light-emitting portions of a substrate, providing an emissive layer on the anode, and co-depositing a transition metal and a fullerene on the substrate including the emissive layers to provide a cathode.

The providing a cathode may include selectively performing deposition in the state of overlapping only the emissive layers.

The display device including the transition metal according to the present disclosure has the following effects.

First, a mixture of a transition metal and a fullerene or a fullerene derivative is formed, and the transition metal is complexed with at least one carbon constituting the fullerene or the fullerene derivative during deposition, whereby stability in deposition of the transition metal may be secured. Instead of using a metal other than the transition metal to prevent aggregation of the transition metal, the fullerene is used to form a complex with the transition metal, whereby deposition stability and reliability are improved.

Second, the transition metal and the fullerene or the fullerene derivative are used to form the cathode, whereby it is possible to maintain high transmittance of the cathode used as a transmission side electrode of the display device while forming the cathode as a thin film. That is, a metal alloy is not required, whereby transmittance is excellent.

Third, it is possible to secure low resistance of the transition metal and the fullerene or the fullerene derivative even in a thin film state for high transmittance. When the cathode having the mixture of the transition metal and the fullerene or the fullerene derivative is applied to the light-emitting device, therefore, it is possible to improve performance of the device.

Fourth, in the case in which the cathode having the mixture of the transition metal and the fullerene or the fullerene derivative is applied to a large-area display device, it is possible to prevent voltage volatility of the cathode. Since a means necessary to prevent voltage drop, such as an auxiliary electrode, may be omitted, it is possible to simplify the structure.

Fifth, when an n-type isomer having high electron mobility is used as a fullerene isomer, electron injection is improved, whereby efficiency is improved.

It will be apparent to those skilled in the art that the present disclosure described above is not limited to the above embodiments and the accompanying drawings and that various substitutions, modifications, and variations can be made without departing from the technical idea of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
an anode at each of a plurality of light-emitting portions of a substrate;
an emissive layer over the anode; and
a cathode above the emissive layers to overlap the plurality of light-emitting portions of the substrate, the cathode comprising a transition metal and a fullerene complexed with the transition metal.

2. The display device according to claim 1, wherein the fullerene is a carbon aggregate having a number of carbon atoms of 20 or more.

3. The display device according to claim 1, wherein the fullerene has a spherical shape or an oval shape.

4. The display device according to claim 3, wherein the transition metal is located in the spherical shape or the oval shape, the transition metal being complexed with one or more carbons of fullerene.

5. The display device according to claim 1, wherein the transition metal is located outside the fullerene, the transition metal being complexed with one or more carbons of fullerene.

6. The display device according to claim 1, wherein a content of the fullerene is 10 vol % or less with respect to a total volume of the cathode.

7. The display device according to claim 1, further comprising an electron injection layer between the emissive layer and the cathode, the electron injection layer comprising a lanthanide metal.

8. The display device according to claim 1, wherein the transition metal comprises scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), gold (Au), or combinations thereof.

9. The display device according to claim 1, further comprising a capping layer over a top of the cathode.

10. The display device according to claim 9, further comprising an inorganic encapsulation layer over a top and sides of the capping layer.

11. The display device according to claim 1, wherein the transition metal of the cathode is a reflective metal.

12. The display device according to claim 1, wherein the cathode has a thickness of 50 Å to 140 Å.

13. The display device according to claim 1, wherein the substrate further comprises a transmission unit between the plurality of light-emitting portions.

14. The display device according to claim 13, wherein the cathode does not overlap the transmission unit.

15. The display device according to claim 13, wherein a portion of the transmission unit corresponds to a lens of a camera located at a backside of the substrate opposite to the anode.

16. The display device according to claim 1, wherein the substrate has a hole, the cathode being spaced apart from the hole by a predetermined distance.

17. A method of manufacturing a display device, the method comprising:
- forming an anode at each of a plurality of light-emitting portions of a substrate;
- depositing an emissive layer on the anode; and
- co-depositing a transition metal and a fullerene on the emissive layers to provide a cathode.

18. The method according to claim 17, wherein the providing the cathode comprises selectively performing deposition to overlap only the emissive layers.

* * * * *